(12) United States Patent
Yang et al.

(10) Patent No.: US 10,222,436 B2
(45) Date of Patent: Mar. 5, 2019

(54) GRADIENT COIL AND MANUFACTURING METHOD

(71) Applicant: General Electric Company, Schenectady, NY (US)

(72) Inventors: Yanzhe Yang, Dayton, OH (US); Steven Robert Hayashi, Niskayuna, NY (US); Kevin Warner Flanagan, Niskayuna, NY (US); Prabhjot Singh, Niskayuna, NY (US); Jian Lin, Shanghai (CN); Jean-Baptiste Mathieu, Florence, SC (US); Kenneth Paul Zarnock, Scotia, NY (US); Thomas Kwok-Fah Foo, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 232 days.

(21) Appl. No.: 15/248,128

(22) Filed: Aug. 26, 2016

(65) Prior Publication Data

US 2017/0059676 A1 Mar. 2, 2017

(30) Foreign Application Priority Data

Aug. 27, 2015 (CN) .......................... 2015 1 0535420

(51) Int. Cl.
*G01R 33/385* (2006.01)

(52) U.S. Cl.
CPC ................ *G01R 33/3858* (2013.01)

(58) Field of Classification Search
CPC .......... G01R 33/20; G01V 3/32; A61B 5/055; G01N 24/00
USPC .......................... 324/200, 300, 301, 307, 309
See application file for complete search history.

(56) References Cited

U.S. PATENT DOCUMENTS

| | | | |
|---|---|---|---|
| 9,991,716 B2 * | 6/2018 | Cutright | H02J 3/383 |
| 9,992,855 B2 * | 6/2018 | Larroux | H05G 1/58 |
| 2001/0043070 A1 * | 11/2001 | Heid | G01R 33/3854 324/318 |
| 2007/0069730 A1 * | 3/2007 | Kimmlingen | G01R 33/3804 324/318 |
| 2016/0069968 A1 * | 3/2016 | Rothberg | G01R 33/3854 324/322 |
| 2017/0319097 A1 * | 11/2017 | Amthor | A61B 5/055 |

* cited by examiner

*Primary Examiner* — Giovanni Astacio-Oquendo (57) ABSTRACT

A gradient coil comprises a curved conductor, which is tubular and has a general spiral shape. The curved conductor is formed by a process comprising depositing at least one non-conductive material layer by layer to form a substrate, and coating at least a portion of a surface of the substrate with a conductive material. The substrate has a shape matching with the general spiral shape of the curved conductor. Embodiments of the present disclosure further refer to a method for manufacturing the gradient coil.

20 Claims, 13 Drawing Sheets

GRADIENT COIL AND MANUFACTURING METHOD

CROSS-REFERENCE TO RELATED APPLICATIONS

This application claims priority to China patent application number 201510535420.4, filed Aug. 27, 2015, the entirety of which is incorporated herein by reference.

BACKGROUND

Embodiments of the present disclosure relate generally to gradient coils and methods for manufacturing the gradient coils.

Gradient coils are important elements in magnetic resonance imaging (MRI) systems. Hollow gradient coils have many benefits, such as good heat dispersion. However, challenges exist in manufacturing the hollow gradient coils. In the conventional methods, the hollow gradient coil is manufactured by winding copper tubing in a plane, and then rolling the winded copper tubing to a curved surface. The rolling process would cause distortion and thus affecting a performance of the gradient coil. The rolling process would also introduce variations between the gradient coils.

In a conventional gradient coil assembly, an insulation layer is usually made of a single material; thus the insulation layer with the same property at any portion thereon, cannot meet different requirements in practice (e.g., requirements for different acoustic properties at different portions).

Therefore, it is desirable to provide a new gradient coil and a new method for manufacturing the gradient coil, in order to solve at least one of the above-mentioned problems.

SUMMARY

In one aspect, a gradient coil comprises a curved conductor, which is tubular and has a general spiral shape. The curved conductor is formed by a process which comprises depositing at least one non-conductive material layer by layer to form a substrate, and coating at least a portion of a surface of the substrate with a conductive material. The substrate has a shape matching with the general spiral shape of the curved conductor.

In another aspect, a method for manufacturing a gradient coil comprises depositing at least one non-conductive material layer by layer to form a substrate, and coating at least a portion of a surface of the substrate with a conductive material to form a curved conductor. The substrate has a shape that matches the general spiral shape of a target gradient coil. The curved conductor has the general spiral shape of the target gradient coil.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In an effort to provide a concise description of these embodiments, not all features of an actual implementation are described in one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of the present disclosure.

Unless defined otherwise, technical and scientific terms used herein have the same meaning as is commonly understood by one of ordinary skill in the art to which the present disclosure belongs. The terms "first," "second," "third," "fourth," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either any, several, or all of the listed items. The use of "including," "comprising," or "having," and variations thereof herein are meant to encompass the items listed thereafter and equivalents thereof as well as additional items.

Gradient coils, as important elements of MRI system, usually have complicated geometries for meeting different performance requirements, which increases difficulty of manufacturing. Hollow gradient coils having complicated geometries are even more difficult to manufacture, because hollow conductors are more difficult to bend and solder than solid conductors.

Figure 1:
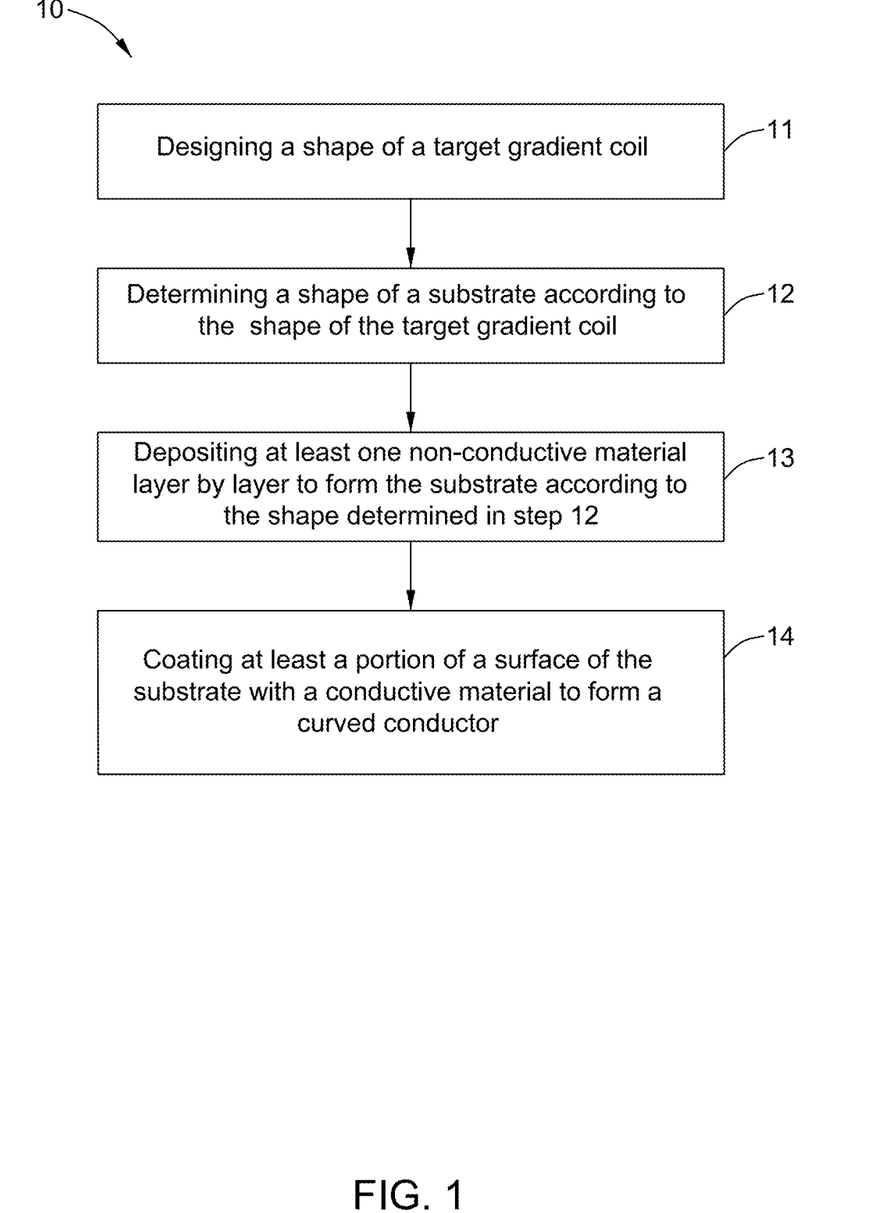
FIG. 1 is a flowchart of a method for manufacturing a gradient coil in accordance with an exemplary embodiment of the present disclosure.
Figure 2:
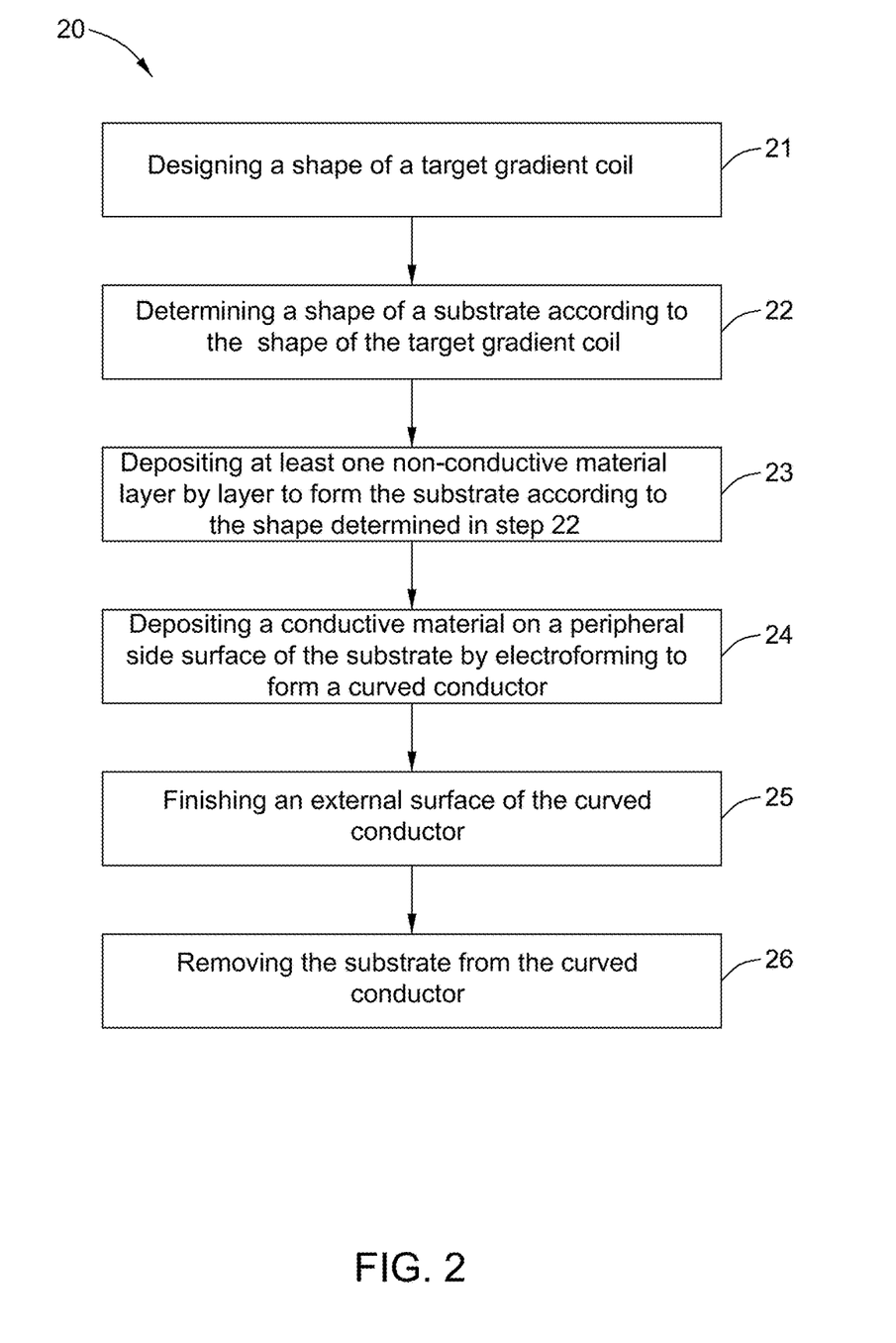
FIG. 2 is a flowchart of a method for manufacturing a gradient coil in accordance with another exemplary embodiment of the present disclosure.
Figure 3:
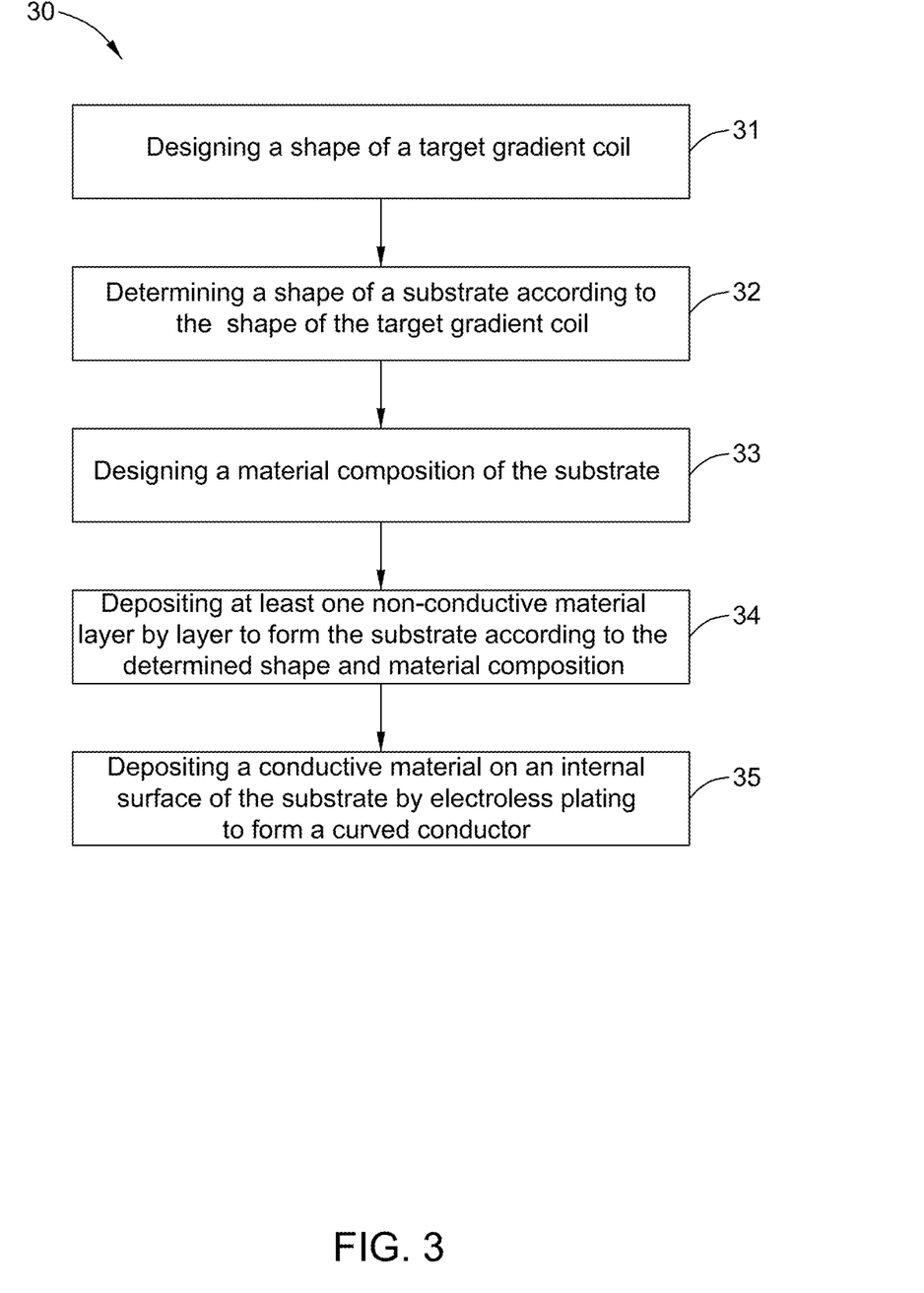
FIG. 3 is a flowchart of a method for manufacturing a gradient coil in accordance with another exemplary embodiment of the present disclosure.

Embodiments of the present disclosure refer to a method for manufacturing a gradient coil using additive manufacturing. The method can be widely applied in manufacturing of hollow gradient coils, and can greatly simplify the manufacturing of hollow gradient coils having complicated geometries. Three exemplary embodiments of the method are respectively illustrated in FIGS. 1-3. While actions of the method are illustrated as functional blocks, the order of the blocks and the separation of the actions among the various blocks shown in FIGS. 1-3 are not intended to be limiting. For example, the blocks may be performed in a different order and an action associated with one block may be combined with one or more other blocks or may be subdivided into a number of blocks.

FIG. 1 is a flowchart of a method 10 for manufacturing a gradient coil in accordance with an exemplary embodiment of the present disclosure. Referring to FIG. 1, the method 10 may comprise steps 11-14, which will be described in detail hereinafter.

In step 11, a shape of a target gradient coil is designed. This step may comprise electromagnetic design and computer-aided design, and may be realized by some software tools. The target gradient coil has a general spiral shape. In some embodiments, the target gradient coil may be disposed on a curved surface.

In step 12, a shape of a substrate is determined according to the shape of the target gradient coil designed in step 11. The substrate has the shape matching with the general spiral shape of the target gradient coil.

In step 13, the substrate is made of at least one non-conductive material by additive manufacturing. More specifically, the substrate is formed by depositing the at least one non-conductive material layer by layer according to the shape determined in step 12. The substrate is also substantially in a spiral shape similar to the target gradient coil. The additive manufacturing, also called as 3D printing, is any of various processes used to make a three-dimensional object. These objects can be of almost any shape or material composition. In the additive manufacturing, successive layers of material are laid down under computer control. The additive manufacturing comprises stereolithography, fused deposition modeling, selective laser sintering and PolyJet. The additive manufacturing may be realized by a 3D printer. The non-conductive material may comprise polymer, acrylonitrile-butadiene-styrene copolymer (ABS), Polycarbonate (PC), Nylon or a combination thereof.

In step 14, at least a portion of a surface of the substrate is coated with a conductive material to form a curved conductor, and the curved conductor has the general spiral shape of the target gradient coil. The surface of the substrate comprises a peripheral side surface. The coating may comprise depositing the conductive material on the peripheral side surface of the substrate by electrochemical deposition, spraying, dipping, brushing or a combination thereof. The electrochemical deposition comprises electroforming, electrolytic plating and electroless plating.

The surface of the substrate may also comprise an internal surface, if the substrate is hollow. The coating may comprise depositing the conductive material on the internal surface of the substrate by electrochemical deposition, spraying, dipping, brushing or a combination thereof. The electrochemical deposition comprises electroforming, electrolytic plating and electroless plating.

FIG. 2 is a flowchart of a method 20 for manufacturing a gradient coil in accordance with another exemplary embodiment of the present disclosure. Referring to FIG. 2, a shape of a target gradient coil is designed, as shown in step 21. This step may comprise electromagnetic design and computer-aided design, and may be realized by some software tools. The target gradient coil is designed to have a general spiral shape.

In step 22, a shape of a substrate is determined according to the shape of the target gradient coil designed in step 21. The substrate has the shape matching with the shape of the target gradient coil. The substrate may be solid or hollow, and has a slightly smaller cross section than the target gradient coil at a corresponding position. The substrate may define a hollow cavity in the target gradient coil. For example, if the target gradient coil is designed to have a cross section of 6 mm*10 mm and a wall thickness of 1 mm, the substrate may have a cross section of 4 mm*8 mm. In another example, if the target gradient coil is designed to have a circular cross section of 8 mm in diameter and a wall thickness of 1.5 mm, the substrate may have a circular cross section of 5 mm in diameter.

In step 23, the substrate is formed by depositing at least one non-conductive material layer by layer according to the shape determined in step 22.

In some embodiments, a peripheral side surface of the substrate is coated to form a curved conductor thereon. A thickness of the coating is substantially identical to the wall thickness of the target gradient coil. As shown in step 24, a conductive material is deposited on the peripheral side surface of the substrate by electroforming to form the curved conductor. The electroforming enables a thick coating of a few millimeters to grow on the peripheral side surface of the substrate. In some embodiments, copper may be used as the conductive material. Using the electroforming to produce the curved conductor may allow using of lower purity copper, which may greatly reduce a production cost. The step of electroforming may not only shape the copper but also purify the copper, thus improving electrical, mechanical and thermal properties of the copper. The step of electroforming may comprise adding an additive to improve a quality of the curved conductor. In some embodiments, an additive level is more than 0.2 percent by volume, and a current density is about 30-60 mA/cm$^2$.

The method 20 may further comprise finishing an external surface of the curved conductor, as shown in step 25. The finishing may comprise polishing, grinding, peening, pickling or a combination thereof.

In some embodiments, the method 20 may further comprise removing the substrate from the curved conductor, as shown in step 26. This step may be realized by thermal methods, for example, heating the curved conductor coupled with the substrate therein. The substrate may be melted during the heating and then blown away from the curved conductor. The step of heating may comprise heating the gradient coil in an atmosphere of $N_2$, in such a manner that the curved conductor will not be oxidized, and thus improving the quality of the curved conductor.

Figure 4:
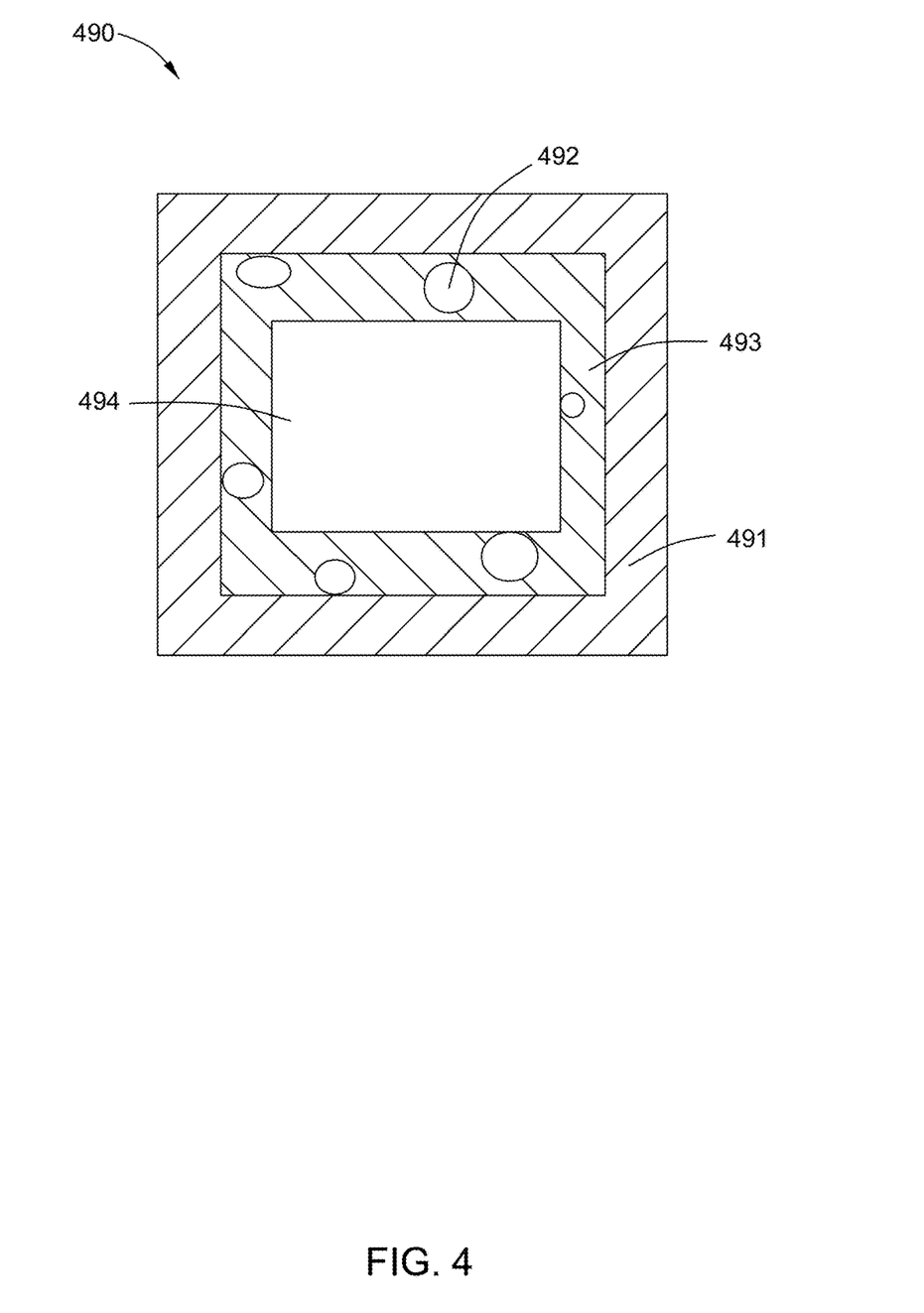
FIG. 4 is a sectional view of a gradient coil coupled with a removable substrate in accordance with an exemplary embodiment of the present disclosure.

The step of removing may also be realized by chemical methods, for example, corroding the substrate by a solvent. The solvent may comprise dichloromethane, chloroform, tetrahydrofuran or a combination thereof. In some embodiments, the removing may comprise forming a plurality of chambers in the substrate, wherein the chambers open onto end surfaces of the substrate; and supplying a solvent to the chambers to remove the substrate. As such, the substrate may be removed more easily. Referring to FIG. 4, FIG. 4 is a sectional view of a gradient coil 490 coupled with a removable substrate and manufactured by the above mentioned steps 21-24. As shown in FIG. 4, the gradient coil 490 comprises a substrate 493 and a curved conductor 491 attached to a peripheral side surface of the substrate 493. The substrate 493 comprises a plurality of chambers 492 therein which are configured to receive a solvent for removing the substrate. The substrate 493 further comprises a channel 494 in a center thereof, which may also receive the solvent.

In one aspect, steps 25-26 may not be necessary, or the sequence of these two steps can be switched.

FIG. 3 is a flowchart of a method 30 for manufacturing a gradient coil in accordance with another exemplary embodiment of the present disclosure. Referring to FIG. 3, the method 30 comprises steps 31-35, which will be described in detail hereinafter.

In step 31, a shape of a target gradient coil is designed. This step may be realized by a design software on a computer. The target gradient coil is substantially in a spiral shape.

In step 32, a shape of a substrate is determined according to the shape of the target gradient coil. The substrate has a shape matching with the shape of the target gradient coil designed in step 31. The substrate is tubular and has an internal surface. The substrate has a larger cross section than the target gradient coil at a corresponding position. The internal surface of the substrate defines an outer shape of the target gradient coil.

In step 33, a material composition of the substrate is designed according to performance requirements of the target gradient coil. Unlike the conventional gradient coils, the gradient coils in one embodiment have a substrate that can be non-homogeneous in material property. The material property mentioned herein comprises mechanical strength, a density, a thermal conductivity, an acoustic impedance or a combination thereof. As such, the substrate is be designed to have different material properties at different locations, in order to optimize an overall performance of the target gradient coil. For example, a flexible material such as rubber may be used at some locations, and a rigid material such as polycarbonate may be used at some other locations. A material with good acoustic damping characteristics may be used for acoustic purpose. A material with enhanced thermal conductivity may be used where more heat is generated.

In step 34, the substrate is formed by depositing at least one non-conductive material layer by layer according to the determined shape and the determined material composition. The substrate may be made of a single non-conductive material or a plurality of non-conductive materials.

In some embodiments, the internal surface of the substrate is coated to form a curved conductor thereon. More specifically, as shown in step 35, a conductive material is deposited on the internal surface of the substrate by electroless plating to form the curved conductor. The electroless plating may comprise physical adsorption of activators or catalysts, exposing the internal surface to a liquid media containing a metal in either a reduced or oxidized state. The activators or catalysts may comprise platinum, gold, palladium or a combination thereof.

In some embodiments, the electroless plating may comprise vacuum sputtering metallic conductors or active catalyst to the internal surface to activate the internal surface, and immersing the internal surface into a liquid solution containing at least both metallic ion and a suitable reducing agent such as formaldehyde. The activated internal surface catalyzes reduction of the metallic ion to the metal and oxidation of the reducing agent, and the deposited metal continues to catalyze deposition of metal until a desired thickness is achieved.

In some other embodiments, the coating may comprise spraying, dipping or brushing with an agent contacting a conductive media. The conductive media may be a dispersion of metal particles or flakes in liquid binding media, for example, conductive copper paint.

Some exemplary gradient coils manufactured by the method 30 are shown in FIGS. 5-8 and described as following.

Figure 5:
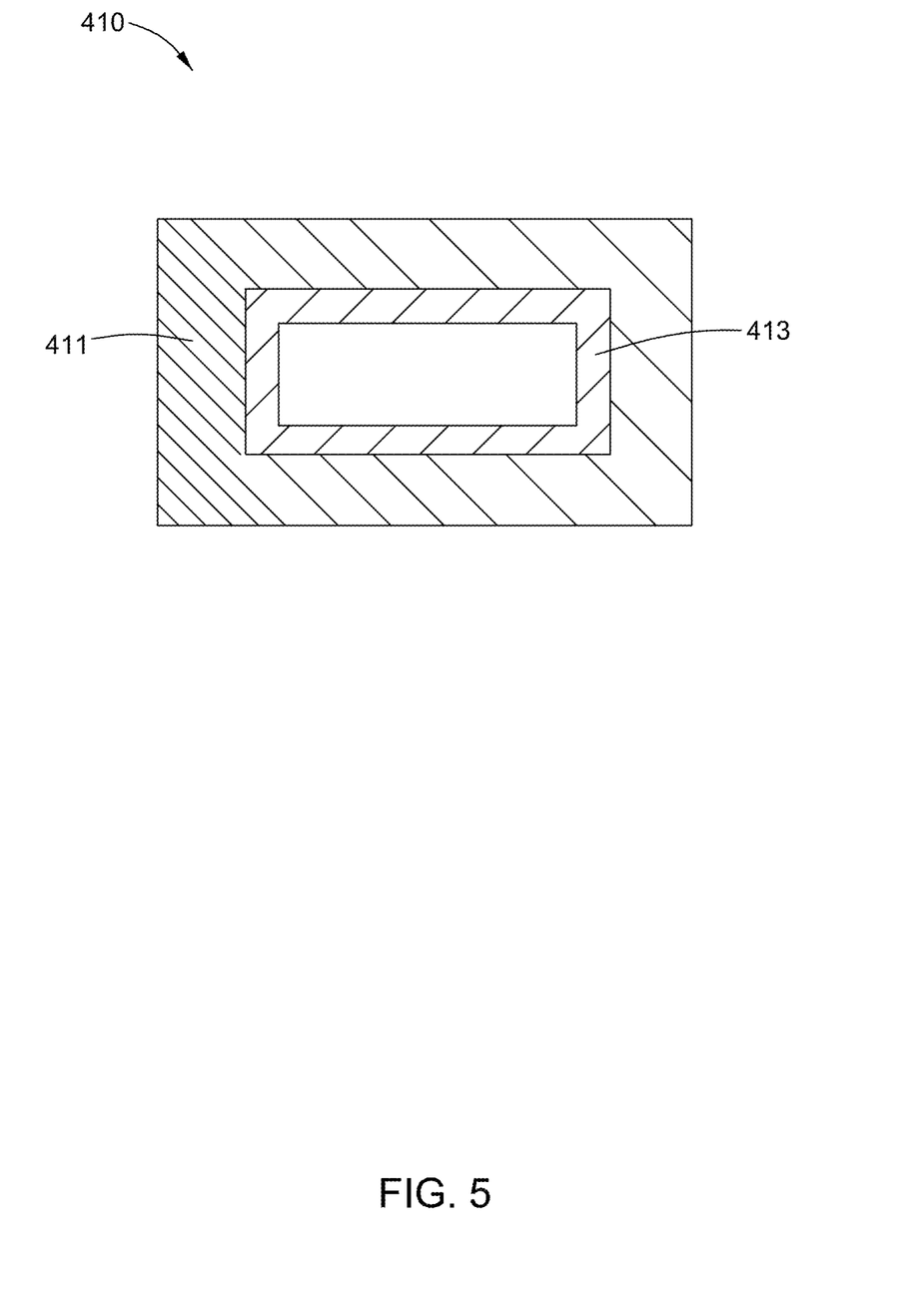
FIG. 5 is a sectional view of a gradient coil in accordance with another exemplary embodiment of the present disclosure.

Referring to FIG. 5, a gradient coil 410 comprises a substrate 411 and a curved conductor 413 attached to an internal surface of the substrate 411. At least one of the material properties of the substrate varies continuously with a location on the substrate. For example, in the embodiment shown in FIG. 5, a density of the substrate 411 decreases gradually from one side to the other side of the substrate 411.

Figure 6:
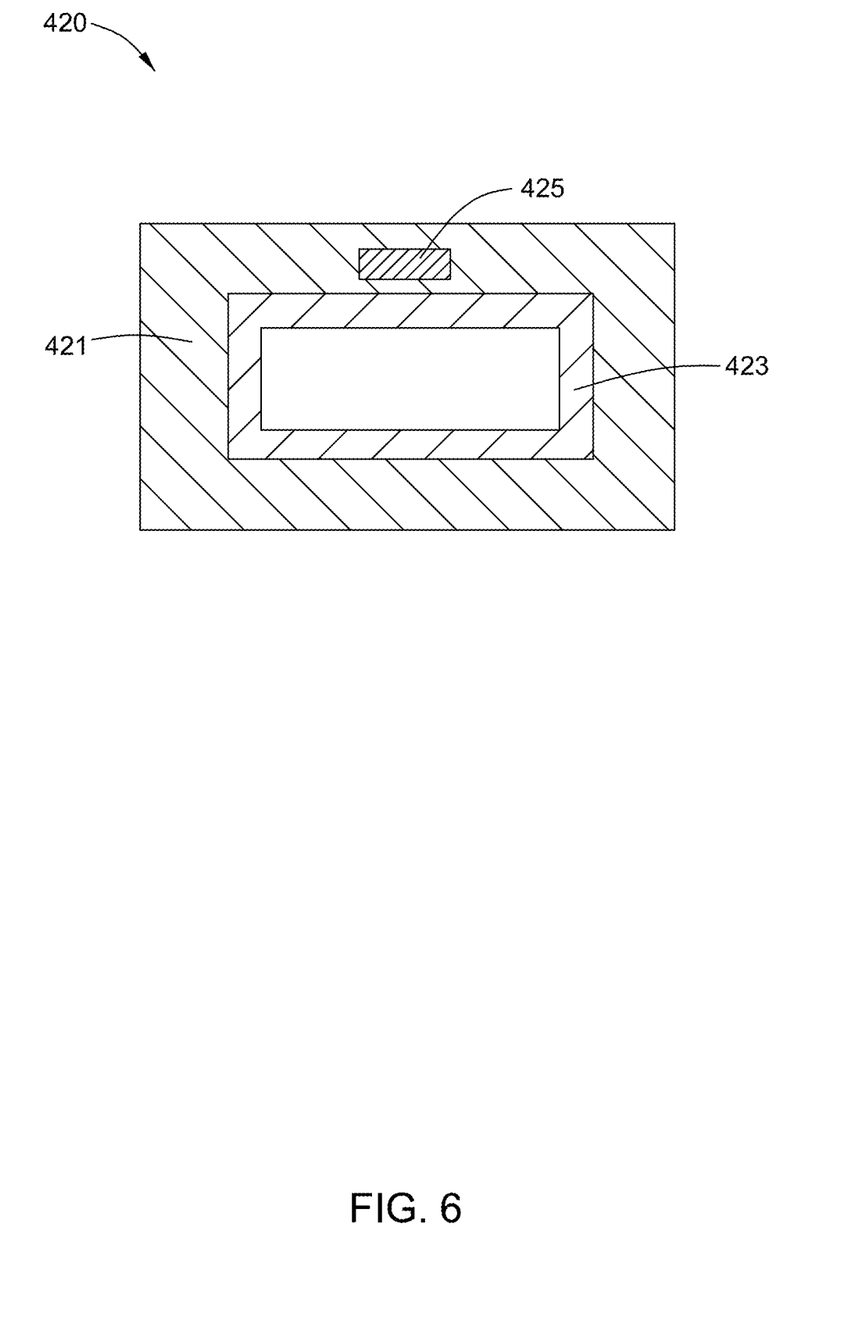
FIG. 6 is a sectional view of a gradient coil in accordance with another exemplary embodiment of the present disclosure.

In some embodiments, the material property of the substrate varies discontinuously with a location on the substrate. Referring to FIG. 6, a gradient coil 420 comprises a substrate 421 and a curved conductor 423 attached to an internal surface of the substrate 421. The substrate 421 comprises at least one area 425 which is made of a different material from an adjacent area. For example, the area 425 is made of a first material, and the adjacent area is made of a second material. The first material has higher mechanical strength than the second material in order to provide a stronger support to a corresponding area on the gradient coil.

Figure 7:
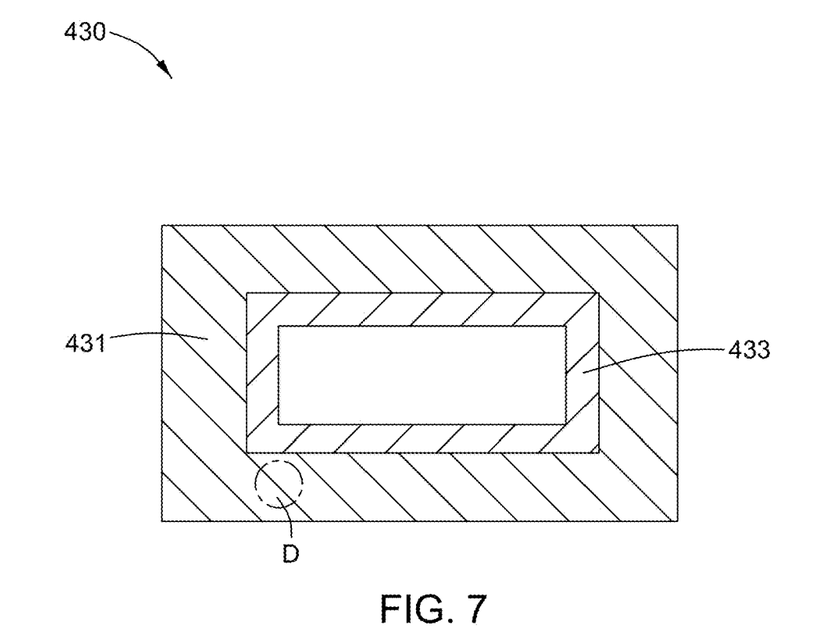
FIG. 7 is a sectional view of a gradient coil in accordance with another exemplary embodiment of the present disclosure.
Figure 8:
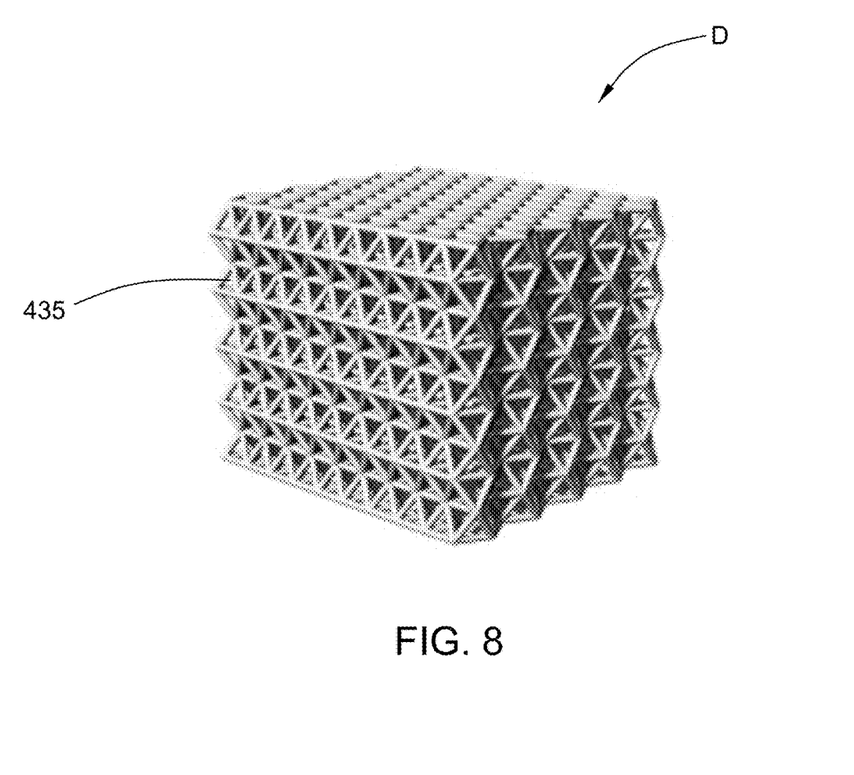
FIG. 8 is a partially enlarged view of a part D in FIG. 7.

The substrate can have a lattice configuration. Referring to FIG. 7, a gradient coil 430 comprises a substrate 431 and a curved conductor 433 attached to an internal surface of the substrate 431. FIG. 8 is a partially enlarged view of a part D of the substrate 431 in FIG. 7. Referring to FIG. 8, the part D comprises a plurality of cells 435 arranged in an array. The substrate 431 may be made of a single material or multiple materials. If the substrate 431 is made of a single material, the material property of the substrate 431 depends on at least one of shapes and sizes of the cells 435. Therefore, the at least one of the shapes and sizes of the cells 435 may vary with a location on the substrate 431, in order to achieve a predetermined performance requirement.

The methods disclosed enable new design patterns that are difficult or even impossible to make before, which improve performance of the MRI system. Some exemplary gradient coils manufactured by the methods are described as following.

Figure 9:
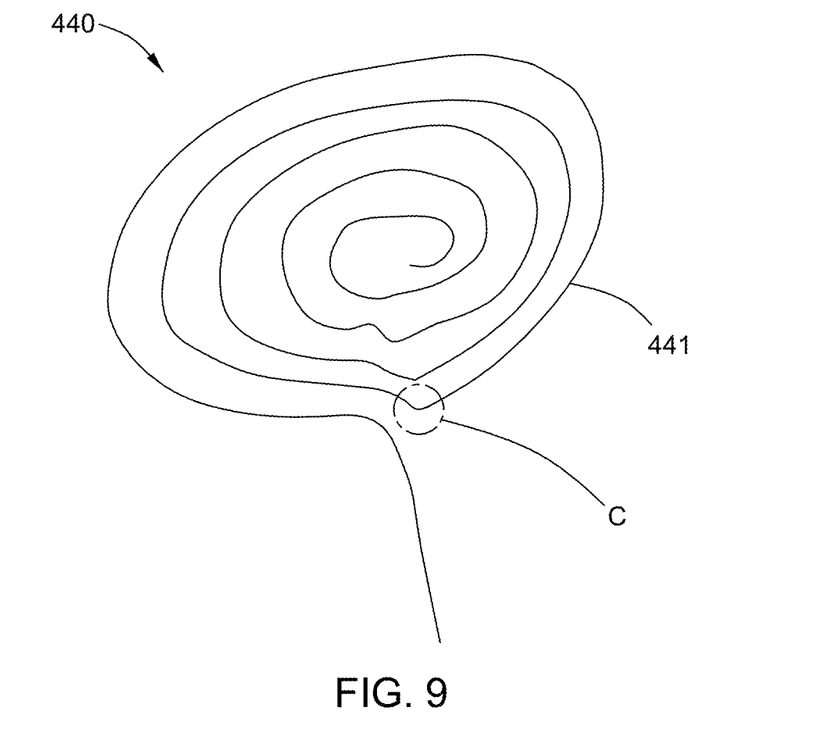
FIG. 9 is a sketch view of a gradient coil in accordance with an exemplary embodiment of the present disclosure.

FIG. 9 is a sketch view of a gradient coil 440 in accordance with an exemplary embodiment of the present disclosure. The gradient coil 440 comprises a curved conductor 441, which is tubular and has a general spiral shape. The curved conductor is formed by a process comprising: depositing a non-conductive material layer by layer to form a substrate, and coating at least a portion of a surface of the substrate with a conductive material; wherein the substrate has a shape matching with the general spiral shape of the curved conductor.

Figure 10:
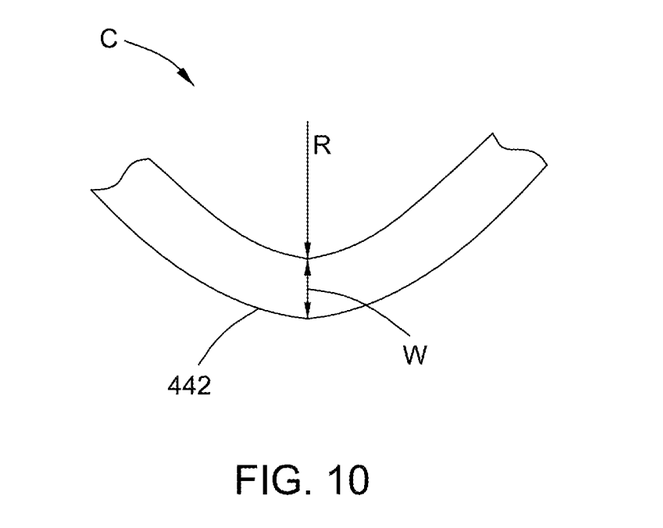
FIG. 10 is a partially enlarged view of a part C in FIG. 9.

FIG. 10 is a partially enlarged view of a part C in FIG. 9. Referring to FIGS. 9-10, the curved conductor 441 comprises at least one section 442. The at least one section 442 has a curvature radius R less than 2.5 times a width W of the section along a direction of the curvature radius, which is difficult to achieve by the conventional methods. The conventional gradient coils are produced by bending straight metal pipes into predetermined shapes, and the curvature radius is usually more than 2.5 times the width of the section along the direction of the curvature radius, because they are limited by a material, a wall thickness and a cross section shape of the metal pipe. If the curvature radius is less than this value, defects such as wrinkle, cross section distortion and crack will appear, because the metal pipe is bended by mechanical force. However, in the embodiment of the present disclosure, the curved conductor 441 is produced by depositing a conductive layer on the surface of the substrate. A shape of the curved conductor 441 depends on a shape of the substrate, which is manufactured by additive manufacturing. The additive manufacturing is able to make objects of almost any shape or geometry, so in the embodiments, the curvature radius less than 2.5 times the width of the section along the direction of the curvature radius is easy to achieve. Therefore, the gradient coil in accordance with the embodiment of the present disclosure may have a tighter and more flexible structure than the conventional gradient coil due to the smaller curvature radius, thus bringing many benefits, such as a reducing of a gradient coil size and more space for other elements in the MRI system.

Figure 11:
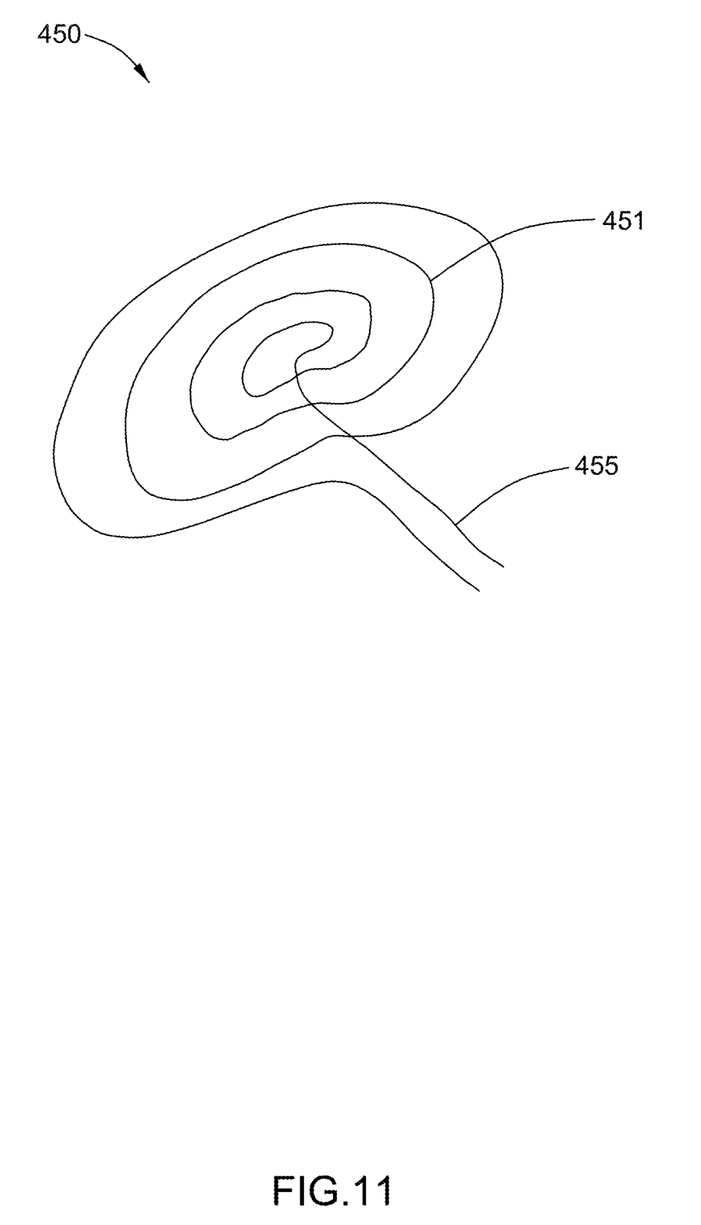
FIG. 11 is a sketch view of a gradient coil in accordance with another exemplary embodiment of the present disclosure.

FIG. 11 is a sketch view of a gradient coil 450 in accordance with another exemplary embodiment of the present disclosure. Referring to FIG. 11, the gradient coil 450 is similar to the gradient coil 440 in FIG. 9. The main difference is that the gradient coil 450 further comprises a branch conductor 455 coupled with the curved conductor 451. The branch conductor 455 is integrated with the curved conductor 451 as a whole. In the conventional gradient coil, a branch conductor is usually coupled with a curved conductor by soldering or brazing, which is a complex and time-consuming process as the curved conductor is hollow. In addition, joints between the branch conductor and the curved conductor are typically root causes for variability and field failure. In this embodiment, the substrate is designed to comprise a portion corresponding to the branch conductor 455, and the portion is integrated with the other portion of the substrate. The branch conductor 455 can be formed integrally with the curved conductor 451 by coating the surface of the substrate.

Figure 12:
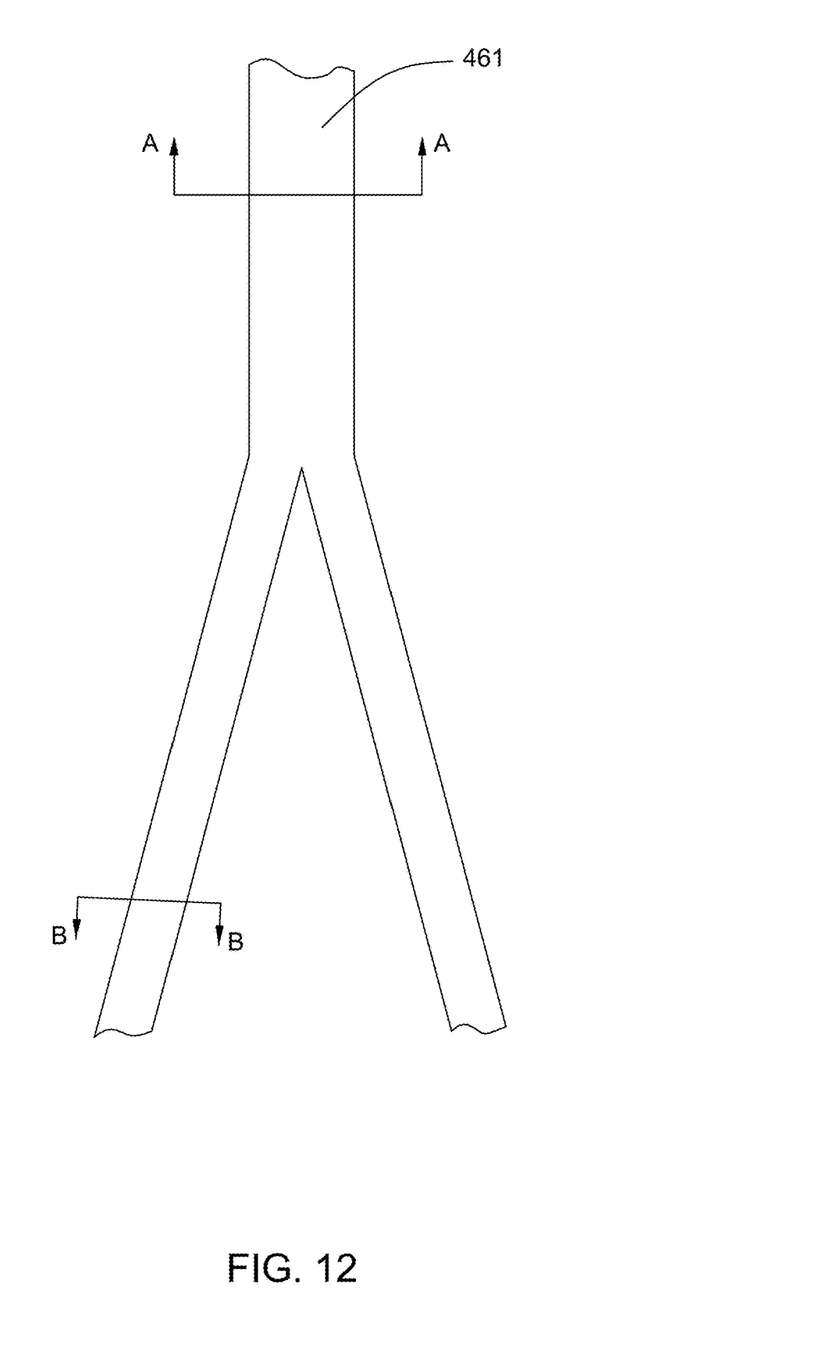
FIG. 12 is a sketch view of a part of a gradient coil in accordance with another exemplary embodiment of the present disclosure.
Figure 13:
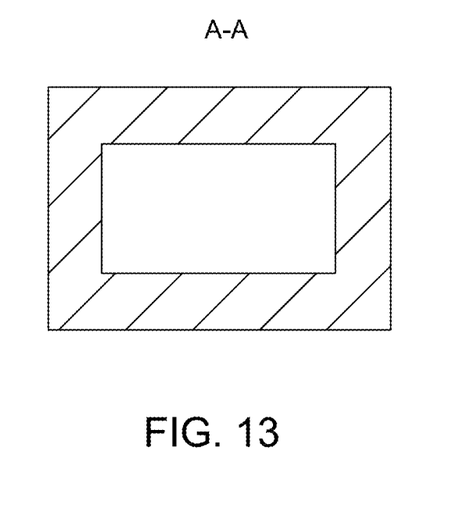
FIG. 13 is a sectional view of the gradient coil taken along line A-A in FIG. 12.
Figure 14:
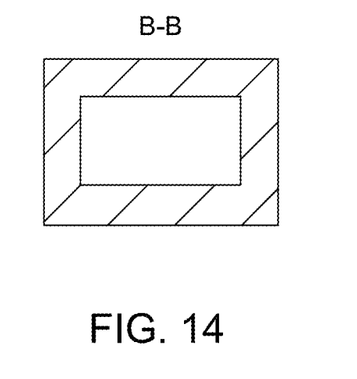
FIG. 14 is a sectional view of the gradient coil taken along line B-B in FIG. 12.

In some embodiments, a cross section of the curved conductor varies in at least one of shape and size along a length of the curved conductor. FIG. 12 is a sketch view of a part 461 of a gradient coil in accordance with an exemplary embodiment of the present disclosure. FIG. 13 is a sectional view of the gradient coil taken along line A-A in FIG. 12. FIG. 14 is a sectional view of the gradient coil taken along line B-B in FIG. 12. Referring to FIGS. 13-14, a cross section A-A has a larger area than a cross section B-B. In some embodiments, some part of the gradient coil is required to be arranged more densely than the other part in order to optimize the overall performance of the MRI system. Therefore, the curved conductors in this part can be designed to have smaller cross section in such a manner that more curved conductors can be arranged in an area of a certain size. However, in the conventional gradient coil, a cross section of the conductor may not be changed, so it will be difficult to arrange the curved conductors more densely in a limited area.

Figure 15:
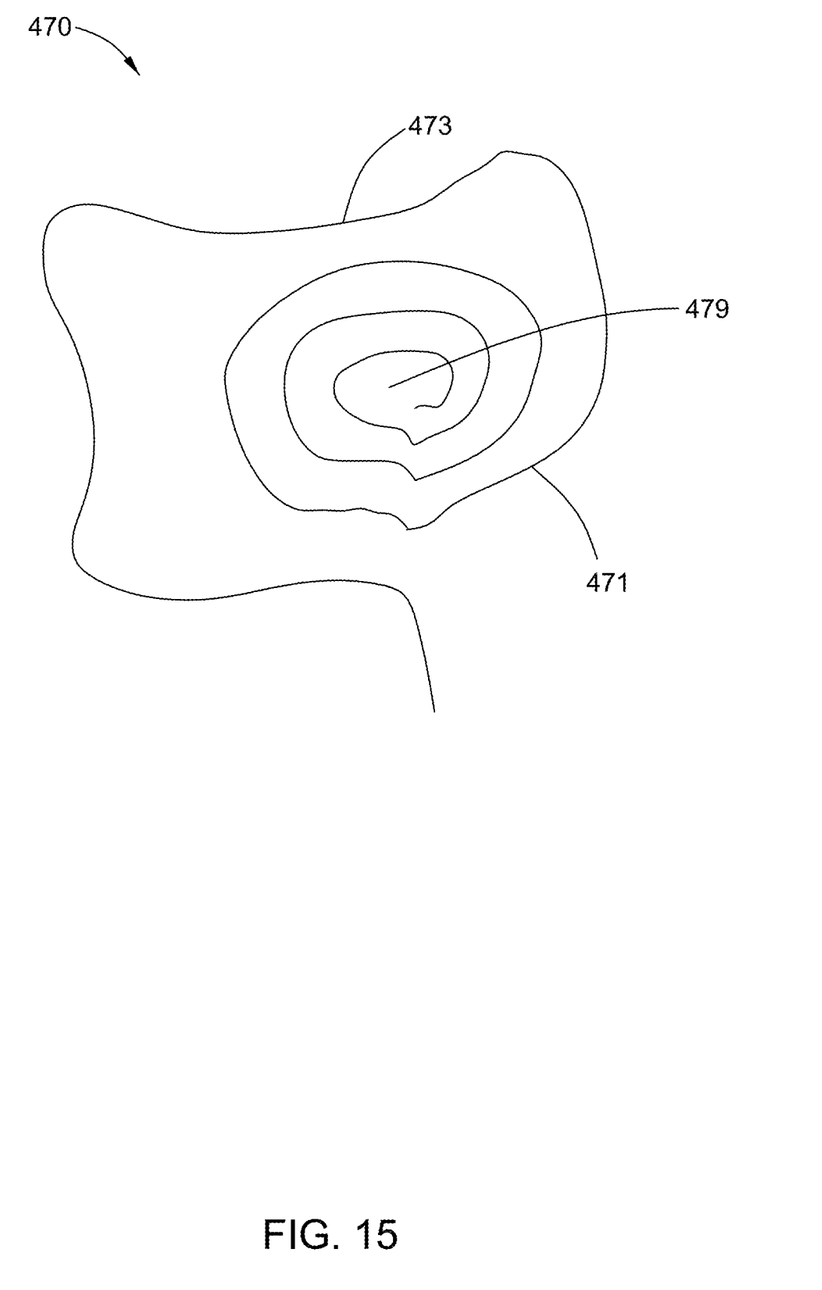
FIG. 15 is a sketch view of a gradient coil in accordance with another exemplary embodiment of the present disclosure.

FIG. 15 is a sketch view of a gradient coil 470 in accordance with another exemplary embodiment of the present disclosure. Referring to FIG. 15, the gradient coil 470 comprises a curved conductor 471, which is substantially in a spiral shape. The curved conductor 471 comprises at least one section 473 which has a center of curvature at a side away from a center 479 of the spiral shape. The at least one section 473 is usually called as a "negative curvature". However, the negative curvature is difficult to manufacture by the conventional method.

Figure 16:
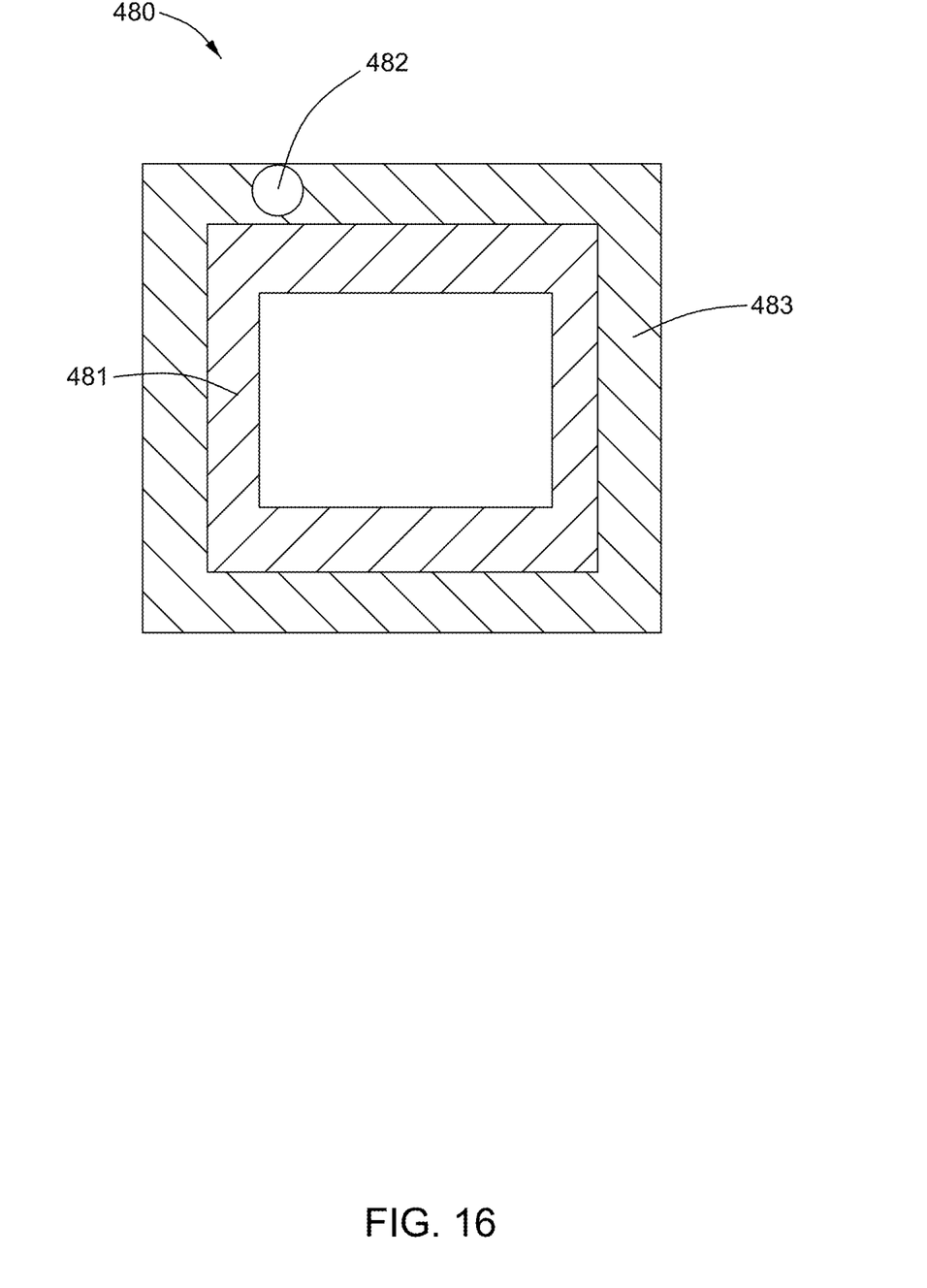
FIG. 16 is a sectional view of a gradient coil in accordance with another exemplary embodiment of the present disclosure.

FIG. 16 is a sectional view of a gradient coil 480 in accordance with another exemplary embodiment of the present disclosure. Referring to FIG. 16, a gradient coil 480 comprises a substrate 483 and a curved conductor 481 attached to an internal surface of the substrate 483. The substrate 483 is tubular and made of a non-conductive material by additive manufacturing, and the substrate 483 may be non-homogeneous in material property. In some embodiments, at least one channel 482 is formed in the substrate 483, and the at least one channel 482 is configured to pass a coolant. The channel 482 may be formed in an area which may be hot when the MRI system is working. The coolant passing through the channel 482 may lower a temperature of this area.

As will be understood by those familiar with the art, the present disclosure may be embodied in other specific forms without depending from the spirit or essential characteristics thereof. Accordingly, the disclosures and descriptions herein are intended to be illustrative, but not limiting, of the scope of the disclosure which is set forth in the following claims.

We claim:

1. A gradient coil comprising:
a curved conductor, which is tubular and has a general spiral shape, wherein the curved conductor is formed by a process comprising:
depositing at least one non-conductive material to form a substrate, the substrate having a shape matching with the general spiral shape of the curved conductor; and
coating at least a portion of a surface of the substrate with a conductive material.

2. The gradient coil according to claim 1, wherein the curved conductor comprises at least one section which has a curvature radius less than 2.5 times a width of the section along a direction of the curvature radius.

3. The gradient coil according to claim 1, further comprising a branch conductor coupled with the curved conductor and integrated with the curved conductor as a whole.

4. The gradient coil according to claim 1, wherein a cross section of the curved conductor varies in at least one of shape and size along a length of the curved conductor.

5. The gradient coil according to claim 1, wherein the curved conductor comprises at least one section which has a center of curvature at a side away from a center of the spiral shape.

6. The gradient coil according to claim 1, wherein the substrate is non-homogeneous in material property so as to optimize a performance of the gradient coil.

7. The gradient coil according to claim 6, wherein the material property comprises mechanical strength, a density, a thermal conductivity, an acoustic impedance or a combination thereof.

8. The gradient coil according to claim 6, wherein the material property of the substrate varies continuously with a location on the substrate.

9. The gradient coil according to claim 6, wherein the material property of the substrate varies discontinuously with a location on the substrate.

10. The gradient coil according to claim 6, wherein the substrate comprises at least one area which is made of a different material from an adjacent area.

11. The gradient coil according to claim 6, wherein the substrate has a lattice configuration.

12. The gradient coil according to claim 11, wherein the substrate comprises a plurality of cells arranged in an array, and the cells vary in at least one of shape and size with a location on the substrate.

13. A method for manufacturing a gradient coil, comprising:
depositing at least one non-conductive material to form a substrate, wherein the substrate has a shape matching with a general spiral shape of a target gradient coil; and
coating at least a portion of a surface of the substrate with a conductive material to form a curved conductor, the curved conductor having the general spiral shape of the target gradient coil.

14. The method according to claim 13, wherein the substrate is tubular, and the coating comprises depositing the conductive material on an internal surface of the substrate by electrochemical deposition, spraying, dipping, brushing or a combination thereof.

15. The method according to claim 13, wherein the coating comprises depositing the conductive material on a peripheral side surface of the substrate by electrochemical deposition, spraying, dipping, brushing or a combination thereof.

16. The method according to claim 15, further comprising removing the substrate from the curved conductor.

17. The method according to claim 16, wherein the removing comprises:
forming a plurality of chambers in the substrate, wherein the chambers open onto end surfaces of the substrate; and
supplying a solvent to the chambers to remove the substrate.

18. The method according to claim 13, wherein the substrate is non-homogeneous in material property.

19. The method according to claim 13, further comprising forming in the substrate at least one area which is made of a different material from an adjacent area.

20. The method according to claim 13, further comprising forming in the substrate at least one channel for passing a coolant.

* * * * *